United States Patent
Chiou

(10) Patent No.: US 10,598,706 B2
(45) Date of Patent: Mar. 24, 2020

(54) METHOD FOR IDENTIFYING ACTIONS OF ELECTRIC EQUIPMENT AND SYSTEM USING THE SAME

(71) Applicant: BenQ ESCO Corp., Taipei (TW)

(72) Inventor: Hung-Wen Chiou, Hsinchu (TW)

(73) Assignee: BenQ ESCO Corp., Taipei (TW)

( * ) Notice: Subject to any disclaimer, the term of this patent is extended or adjusted under 35 U.S.C. 154(b) by 307 days.

(21) Appl. No.: 15/661,096

(22) Filed: Jul. 27, 2017

(65) Prior Publication Data

US 2018/0038900 A1 Feb. 8, 2018

(30) Foreign Application Priority Data

Aug. 8, 2016 (TW) .............................. 105125158 A

(51) Int. Cl.
| | |
|---|---|
| *G01R 21/133* | (2006.01) |
| *G01R 31/02* | (2006.01) |
| *H04L 12/28* | (2006.01) |
| *G01R 35/00* | (2006.01) |

(Continued)

(52) U.S. Cl.
CPC ............ *G01R 21/133* (2013.01); *A47J 31/52* (2013.01); *G01R 19/2506* (2013.01);
(Continued)

(58) Field of Classification Search
CPC ............ H04L 12/2807; H04L 12/2816; H04L 12/2823; H04L 2012/285; H02J 13/002;
(Continued)

(56) References Cited

U.S. PATENT DOCUMENTS 8,301,625 B2 * 10/2012 Sugaya ............... H04L 12/2809
 707/723
8,447,541 B2 * 5/2013 Rada ......................... G05F 1/70
 62/130

(Continued)

FOREIGN PATENT DOCUMENTS

| CN | 103245847 A | 8/2013 |
| CN | 105453361 | 3/2016 |

(Continued)

OTHER PUBLICATIONS

Office action of counterpart application by SIPO of PROC dated Jan. 14, 2019.

(Continued)

*Primary Examiner* — Crystal J Barnes-Bullock

(57) ABSTRACT

A method for identifying actions of an electric equipment is provided. The method includes: measuring a utility power signal of the electric equipment during a period of time; analyzing a waveform characteristic of the utility power signal in the period of time to acquire a set of characteristic values, and identifying a current control procedure corresponding to the utility power signal from a set of control procedures according to the set of characteristic values, the current control procedure including one or more action stages whose first action stage corresponds to a first action parameter; determining whether a deviation between the waveform characteristic of the utility power signal corresponding to the first action stage and the first action parameter is within a tolerance range; triggering a warning event when the deviation between the waveform characteristic of the utility power signal and the first action parameter is outside the tolerance range.

20 Claims, 3 Drawing Sheets

(51) Int. Cl.
    *H02J 13/00*     (2006.01)
    *G06Q 10/06*     (2012.01)
    *G06Q 50/06*     (2012.01)
    *G01R 19/25*     (2006.01)
    *A47J 31/52*     (2006.01)
    *G05B 19/048*     (2006.01)

(52) U.S. Cl.
    CPC ........... *G01R 31/02* (2013.01); *G01R 35/005* (2013.01); *G05B 19/048* (2013.01); *G06Q 10/0633* (2013.01); *G06Q 50/06* (2013.01); *H02J 13/002* (2013.01); *H04L 12/2807* (2013.01); *H04L 12/2816* (2013.01); *H04L 12/2823* (2013.01); *G05B 2219/24015* (2013.01); *H04L 2012/285* (2013.01); *Y02B 70/325* (2013.01); *Y02B 70/3266* (2013.01); *Y02B 90/245* (2013.01); *Y02B 90/2615* (2013.01); *Y04S 20/38* (2013.01); *Y04S 20/40* (2013.01)

(58) Field of Classification Search
    CPC .... G01R 21/00; G01R 21/133; G01R 35/005; G06Q 10/0633; G06Q 50/06; Y04S 20/38; Y04S 20/40; Y04S 40/121; Y02B 70/325; Y02B 70/3266; Y02B 90/245; Y02B 90/2615
    See application file for complete search history.

(56) References Cited

U.S. PATENT DOCUMENTS

| | | | | |
|---|---|---|---|---|
| 8,832,089 | B2 * | 9/2014 | Sugaya | H04L 12/2809 707/723 |
| 8,832,090 | B2 * | 9/2014 | Sugaya | H04L 12/2809 707/723 |
| 9,020,769 | B2 * | 4/2015 | Rada | G01D 4/00 702/176 |
| 9,190,844 | B2 * | 11/2015 | Tran | H02J 3/14 |
| 9,235,825 | B2 * | 1/2016 | Shao | H02J 3/14 |
| 9,244,116 | B2 * | 1/2016 | Kabler | G01R 31/2836 |
| 9,250,101 | B2 * | 2/2016 | Davies | G01D 4/00 |
| 9,823,283 | B2 * | 11/2017 | Kabler | G01R 31/2836 |
| 9,857,414 | B1 * | 1/2018 | Kabler | G06Q 50/06 |
| 9,971,388 | B2 * | 5/2018 | Trieb | G06F 1/28 |
| 10,274,573 | B2 * | 4/2019 | Toizumi | G06Q 10/00 |
| 2012/0166115 | A1 * | 6/2012 | Apostolakis | G06Q 50/06 702/62 |
| 2013/0204552 | A1 | 8/2013 | Lin et al. | |
| 2014/0248802 | A1 * | 9/2014 | Hieda | H04L 12/2818 439/620.01 |
| 2015/0253364 | A1 * | 9/2015 | Hieda | H04Q 9/00 702/62 |
| 2017/0235290 | A1 * | 8/2017 | Weber | H04W 4/38 700/276 |
| 2018/0034657 | A1 * | 2/2018 | Brown | G06Q 10/06 |
| 2018/0239311 | A1 * | 8/2018 | Haslett | G06Q 10/04 |

FOREIGN PATENT DOCUMENTS

| | | |
|---|---|---|
| TW | I443356 B | 7/2014 |
| TW | I510792 | 12/2015 |

OTHER PUBLICATIONS

Office action of counterpart application by Taiwan office action dated Dec. 6, 2016.

* cited by examiner

METHOD FOR IDENTIFYING ACTIONS OF ELECTRIC EQUIPMENT AND SYSTEM USING THE SAME

This application claims the benefit of Taiwan application Serial No. 105125158, filed Aug. 8, 2016, the subject matter of which is incorporated herein by reference.

BACKGROUND OF THE INVENTION

Field of the Invention

The invention relates in general to a method for identifying actions of an electric equipment and an action identification system using the same.

Description of the Related Art

Along with the development in technology, in order to save manpower and time cost, the demand for automatic electric equipment is increasing. The automatic electric equipment can achieve specific processing or manufacture specific products by executing a series of predetermined procedures. Let the coffee machine be taken for example. The operator only need to select his/her desired coffee type, such as Mocha, Latte, on the machine, and the coffee machine will activate a series of corresponding procedures to brew the user's desired coffee.

During the execution of an automatic procedure, the electric equipment may fail to comply with the parameter of the predetermined procedure due to the factors such as internal elements or external operations. Although the electric equipment may appear to be in an operating state, the operator may fail to detect operating abnormality, and the output quality of the electric equipment will thus be affected.

Taiwanese patent number TWI443356 discloses a method of detecting an abnormal state of an electric equipment. According to the said method, the data of power consumption of the electric equipment within a predetermined time is collected and analyzed to generate various reference values of power consumption of the electric equipment under normal operation. The reference values of power consumption are used as a basis for determining whether abnormality occurs to the electric equipment. However, the prior art is unable to determine the electric equipment having a plurality of the control procedures currently operated under which procedure or which stage of the procedure, and is unable to determine whether the control procedure executed by the electric equipment or the operating state of the electric equipment complies with the standards.

Therefore, it has become a prominent task for the industry to provide a method for identifying actions of an electric equipment and an action identification system using the same to instantaneously monitor whether the electric equipment executes the procedures according to predetermined parameters.

SUMMARY OF THE INVENTION

The invention is directed to a method for identifying actions of an electric equipment and an action identification system using the same capable of identifying an action of the electric equipment according to the utility power signal of the electric equipment and determining whether the action complies with the predetermined parameter, and further triggering a warning event when abnormality is detected.

According to one embodiment of the present invention, a method for identifying actions of an electric equipment is provided. The method includes: measuring, by a sensor, a utility power signal of the electric equipment during a period of time; analyzing, by a computing controller, a waveform characteristic of the utility power signal in the period of time to acquire a set of characteristic values, and identifying a current control procedure corresponding to the utility power signal from a set of control procedures according to the set of characteristic values, wherein the current control procedure includes one or more action stages whose first action stage corresponds to a first action parameter; determining, by the computing controller, whether a deviation between the waveform characteristic of the utility power signal corresponding to the first action stage and the first action parameter is within a tolerance range; triggering a warning event by the computing controller when the deviation between the waveform characteristic of the utility power signal corresponding to the first action stage and the first action parameter is outside the tolerance range. Each control procedure of the set of control procedures corresponds to a sample characteristic, and the action identifying method further comprises: comparing the set of characteristic values with the sample characteristics corresponding to the control procedures to select a control procedure whose sample characteristic is closest to the set of characteristic values from the set of control procedures and using the selected control procedure as the current control procedure.

According to another embodiment of the invention, a method for identifying actions of an electric equipment is provided. The method includes: measuring, by a sensor, a utility power signal of the electric equipment during a period of time; analyzing, by a computing controller, a waveform characteristic of the utility power signal in the period of time to acquire a set of characteristic values, and identifying a current control procedure corresponding to the utility power signal from a set of control procedures according to the set of characteristic values, wherein the current control procedure includes one or more action stages whose first action stage corresponds to a first action parameter; determining, by the computing controller, whether a deviation between the waveform characteristic of the utility power signal corresponding to the first action stage and the first action parameter is within a tolerance range; triggering, by the computing controller, a warning event when the deviation between the waveform characteristic of the utility power signal corresponding to the first action stage and the first action parameter is outside the tolerance range. The step of triggering the warning event comprises: controlling, by the computing controller, a signal transceiver to transmit a warning signal to a remote management platform.

According to another embodiment of the invention, an action identification system applicable to an electric equipment is provided. The action identification system includes a sensor and a computing controller. The sensor is used for measuring a utility power signal of the electric equipment during a period of time. The computing controller is coupled to the sensor and used for: analyzing a waveform characteristic of the utility power signal in the period of time to acquire a set of characteristic values, and identifying a current control procedure corresponding to the utility power signal from a set of control procedures according to the set of characteristic values, wherein the current control procedure comprises one or more action stages whose first action stage corresponds to a first action parameter; determining whether a deviation between the waveform characteristic of the utility power signal corresponding to the first action stage and the first action parameter is within a tolerance range; and triggering a warning event when the deviation between the waveform characteristic of the utility power signal corresponding to the first action stage and the first action parameter is outside the tolerance range. Each control procedure of the set of control procedures corresponds to a sample characteristic, and the computing controller compares the set of characteristic values with the sample characteristics corresponding to the control procedures to select a control procedure whose sample characteristic is closest to the set of characteristic values from the set of control procedures and uses the selected control procedure as the current control procedure.

The above and other aspects of the invention will become better understood with regard to the following detailed description of the preferred but non-limiting embodiment(s). The following description is made with reference to the accompanying drawings.

DETAILED DESCRIPTION OF THE INVENTION

A number of embodiments of the present invention are disclosed below with reference to accompanying drawings, but not every embodiment is illustrated in accompanying drawings. In practical application, the present invention can have different variations and is not limited to the embodiments exemplified in the specification. A number of embodiments are disclosed in the present disclosure to meet the statutory requirements. Designations common to the accompanying drawings are used to indicate identical or similar elements.

Figure 1:
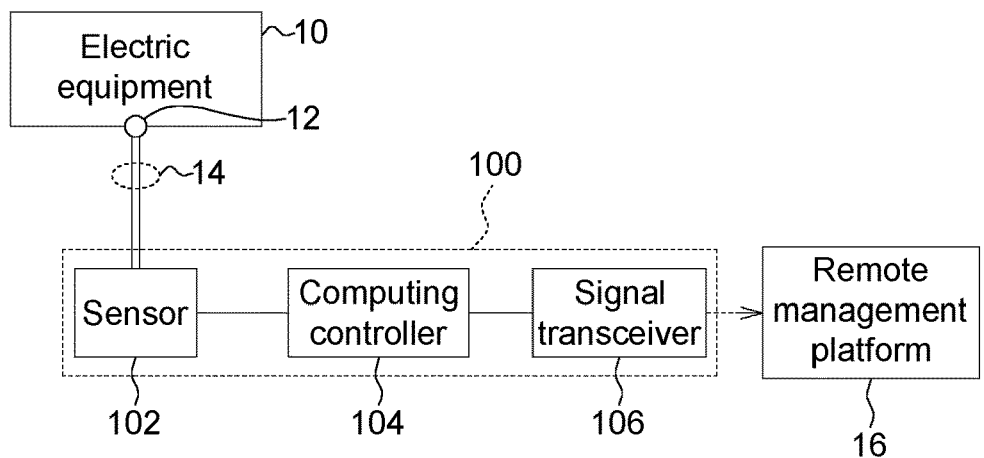
FIG. 1 is a schematic diagram of an action identification system according to an embodiment of the invention.

FIG. 1 is a schematic diagram of an action identification system 100 according to an embodiment of the invention. The action identification system 100 is applicable to an electric equipment 10. By detecting and analyzing a utility power signal of the electric equipment 10, the action identification system 100 can identify the action currently executed by the electric equipment 10, and trigger a warning event when abnormality is detected. The electric equipment 10 can be realized by any electric equipment executing an automation procedure. For example, the electric equipment 10 is such as a coffee machine, a smart washing machine or a smart rice cooker.

The action identification system 100 mainly includes a sensor 102 and a computing controller 104. The sensor 102 can be realized by a current sensor, a voltage sensor or other elements capable of capturing the utility power signal of the electric equipment 10. The sensor 102 can be disposed either inside or outside the electric equipment 10. For example, the sensor 102 can be disposed in a smart watch which is external to the electric equipment 10 and connected to the power input end 12 of the electric equipment 10 through a power supply line 14. Or, the sensor 102 can be disposed inside the electric equipment 10 and coupled to the power input end 12 of the electric equipment 10. The power input end 12 refers to an interface through which the electric equipment 10 receives power from an external power source (such as the utility power).

The computing controller 104 is coupled to the sensor 102 and configured for analyzing and identifying a utility power signal of the sensor 102, and triggering a warning event when abnormality is detected. The computing controller 104 can be realized by a micro-processor, a micro-controller, a special purpose application circuit, or other circuits capable of identifying signal characteristics. The actuation of the computing controller 104 is described with accompanying drawings FIG. 2 and FIG. 3.

In an embodiment, the action identification system 100 further includes a signal transceiver 106 which is controlled by the computing controller 104. When the computing controller 104 triggers a warning event, the computing controller 104 will control the signal transceiver 106 to transmit a warning signal to a remote management platform 16 to notify relevant personnel or monitoring equipment that abnormality occurs to the electric equipment 10.

Figure 2:
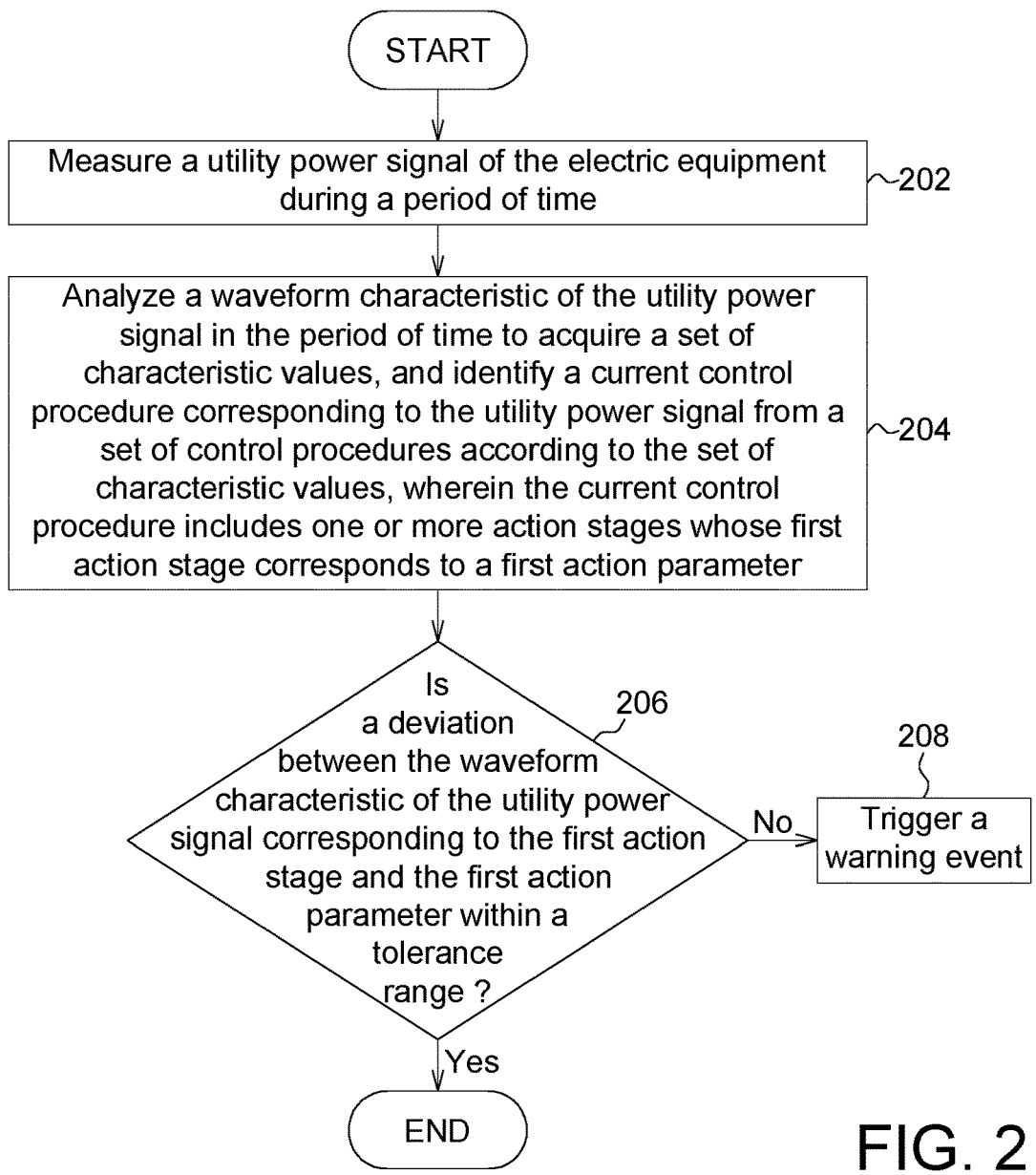
FIG. 2 is a flowchart of an example of a method for identifying actions of an electric equipment.

FIG. 2 is a flowchart of an example of a method for identifying actions of an electric equipment 10. In step 202, a utility power signal of the electric equipment is measured by a sensor 102 during a period of time. In an embodiment, the utility power signal includes a power factor signal measured at a power input end 12 of the electric equipment 10. In an alternate embodiment, the utility power signal further includes at least one of a current signal and a voltage signal measured at the power input end 12 of the electric equipment 10.

In step 204, a waveform characteristic of the utility power signal is analyzed by the computing controller 104 in the period of time to acquire a set of characteristic values, and a current control procedure corresponding to the utility power signal is identified from a set of control procedures according to the set of characteristic values, wherein the current control procedure includes one or more action stages whose first action stage corresponds to a first action parameter, such as a predetermined action time.

In an embodiment, the computing controller 104 can perform a pattern recognition process to waveform change of the utility power signal during a period of time to determine the set of characteristic values of the utility power signal according to a time domain characteristic and/or a frequency domain characteristic of the utility power signal. For example, the set of characteristic values of the utility power signal includes one or more signal characteristic values, such as characteristic point of waveform change in a time domain characteristic and/or a frequency domain characteristic of the utility power signal (such as the peak value of a signal, or the maximum slope of a tangent), or waveform segment with a specific pattern.

Generally, during the execution of a control procedure, the utility power signal of the electric equipment 10 will generate specific waveform changes in different action stages. Therefore, the computing controller 104, by comparing the set of characteristic values of the utility power signal with pre-stored sample characteristics of the control procedure, can identify the control procedure currently executed by the electric equipment 10. In an embodiment, each control procedure of the set of control procedures corresponds to a sample characteristic, the computing controller 104, by comparing the set of characteristic values with the sample characteristics corresponding to the control procedures, can select a control procedure whose sample characteristic is closest to the set of characteristic values from the set of control procedures and use the selected control procedure as the current control procedure of the electric equipment 10.

The set of control procedures includes all control procedures that can possibly be executed by the electric equipment 10. Suppose the electric equipment 10 is a coffee machine which can brew four kinds of coffee, namely, Mocha, Latte, Americano and Cappuccino. Then, the action identification system 100 can pre-store control procedures A, B, C, and D corresponding to the four kinds of coffee. In an embodiment, the information of the set of control procedures are recorded in a storage medium, such as a memory or a look-up table (LUT), of the action identification system 100 and can be accessed by the computing controller 104.

Each of the control procedures A, B, C, and D includes one or more corresponding action stages. When the electric equipment 10 is exemplified by a coffee machine, the one or more action stages includes at least one of a boiler heating stage, a solenoid valve switch stage, a coffee extraction stage and a grinding stage. For the control procedures A, B, C, and D, the execution order, execution items, execution time and element control parameter (such as the extraction pressure, the boiler temperature, and the water flow) in each action stage may vary from one control procedure to another. Therefore, the utility power signal will generate different waveforms when the electric equipment 10 executes different control procedures A, B, C, and D. Based on the said characteristics, the waveform templates of the utility power signal respectively corresponding to the control procedures A, B, C, and D can be defined. The waveform templates of the utility power signal can be described by predetermined sample characteristics (such as a set of characteristic points corresponding to a specific waveform). When the computing controller 104 determines that the set of characteristic values of the utility power signal of the electric equipment 10 is close to some or all sample characteristics of a specific control procedure (such as the control procedure A) but is different from the sample characteristics of other control procedures (such as the control procedures B, C, and D), the computing controller 104 can identify that the control procedure currently executed by the electric equipment 10 is the control procedure A, that is, the coffee machine is brewing Mocha.

In step 206, whether a deviation between the waveform characteristic of the utility power signal corresponding to the first action stage and the first action parameter is within a tolerance range is determined by the computing controller 104. If so, the method terminates; otherwise, the method proceeds to step 208.

The first action stage can be any action stage of the current control procedure. The first action parameter can be any action parameter related to the first action stage. For example, the first action parameter can be a predetermined action time, a predetermined voltage value, a predetermined current value or a predetermined power factor value of the first action stage. For example, one or more action stages of the current control procedure having strictest requirement of time is set as the first action stage. Preferably, the predetermined action time of the first action stage is set as the first action parameter. Let the coffee machine be taken for example. When brewing coffee, the length of coffee extraction time is essential to the taste of coffee. Therefore, the coffee extraction stage is set as the first action stage, and the predetermined action time of the coffee extraction stage is set as the first action parameter, which is used as a reference for determining whether abnormality occurs to the electric equipment 10. For example, after the computing controller 104, based on the measured utility power signal, identifies that the control procedure currently executed by the electric equipment 10 corresponds to the control procedure A for brewing Mocha, the computing controller 104 further determines whether the length of waveform change of the utility power signal corresponding to the coffee extraction stage of the control procedure A complies with the predetermined time requirement of the coffee extraction stage. For example, the length of time is S seconds. If the computing controller 104 detects that the utility power signal corresponding to the coffee extraction stage of the control procedure A has the said characteristic of waveform change, but the deviation between the time interval of waveform change and the predetermined action time of the coffee extraction stage is outside a tolerance range, then the computing controller 104 determines that abnormality occurs to the electric equipment 10, and the method proceeds to step 208.

In step 208, when the deviation between the waveform characteristic of the utility power signal corresponding to the first action stage and the first action parameter is outside the tolerance range, the computing controller 104 triggers a warning event. The warning event can be implemented by sounds or lights, wired signals or wireless signals to achieve a warning effect. For example, the warning event can be implemented by turning on a flashing light, starting a buzzer or outputting a wired or wireless warning signal to an external monitoring management device. Let the warning event be exemplified by outputting a wireless warning signal. The computing controller 104 controls the signal transceiver 106 to transmit a warning signal to a remote management platform 16. In response to the warning signal received from the action identification system 100, the remote management platform 16 can execute actions of remote management, such as updating an abnormality identification value of the electric equipment 10, adding an abnormality identification logic, automatically notifying maintenance personnel and updating maintenance records, to notify relevant personnel or monitoring equipment that abnormality occurs to the electric equipment 10 and update relevant monitoring data.

Figure 3:
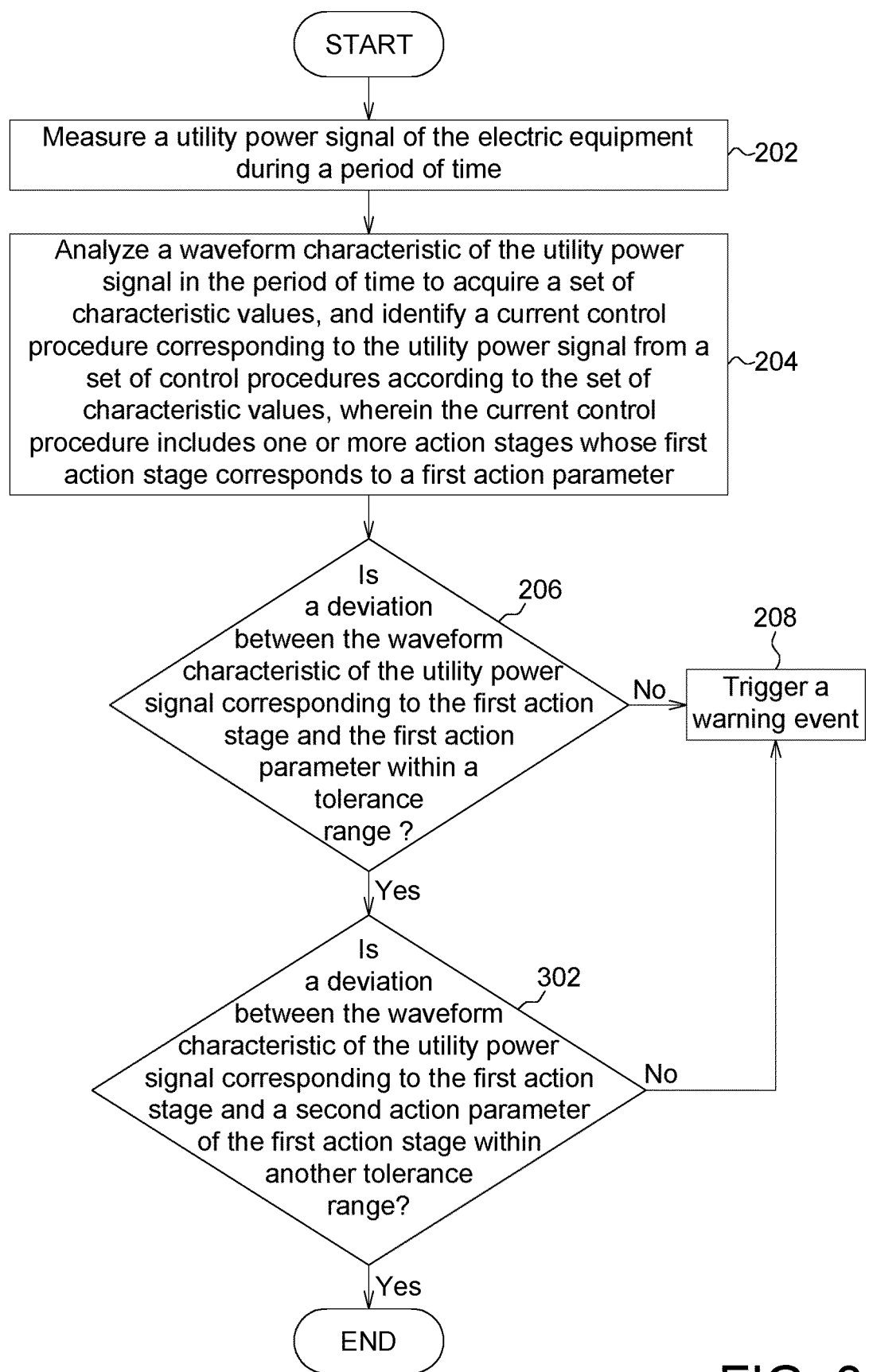
FIG. 3 is a flowchart of another example of a method for identifying actions of an electric equipment.

FIG. 3 is a flowchart of another example of a method for identifying actions of an electric equipment 10. The present embodiment of FIG. 3 is different from the embodiment of FIG. 2 mainly in that when the determination result of step 206 is positive, the method proceeds to step 302, whether the deviation between the waveform characteristic of the utility power signal corresponding to the first action stage and a second action parameter of the first action stage is within another tolerance range is further determined by the computing controller 104. If the determination result is negative, the method proceeds to step 208, a warning event is triggered by the computing controller 104.

The second action parameter can be any action parameter related to the first action stage but different from the first action parameter. For example, the second action parameter can be a predetermined action time, a predetermined voltage value, a predetermined current value or a predetermined power factor value of the first action stage but the electric parameter type of the second action parameter is different from that of the first action parameter. For example, when the first action parameter is the predetermined action time of the first action stage, the second action parameter is at least one of the predetermined voltage value, the predetermined current value and the predetermined power factor value of the first action stage.

In an embodiment, the computing controller 104 determines at least one of the following conditions (1), (2), (3) in step 302, and triggers a warning event when the conditions are not satisfied.

Condition (1): the difference between the voltage value of the utility power signal and the predetermined voltage value corresponding to the first action stage is within a tolerance range of voltage. Condition (2): the difference between the current value of the utility power signal and the predetermined current value corresponding to the first action stage is within a tolerance range of current. Condition (3): the difference between the power factor value of the utility power signal and the predetermined power factor value corresponding to the first action stage is within a tolerance range of power factor.

Suppose the utility power signal includes a current signal and a power factor signal measured at the power input end 12. When the computing controller 104 determines that a deviation between the fluctuation time of the utility power signal corresponding to the first action stage and the predetermined action time corresponding to the first action stage is within a tolerance range, the computing controller 104 further determines whether the deviations between the current value and power factor value of the utility power signal corresponding to the first action stage and the predetermined current value and predetermined power factor value corresponding to the first action stage are respectively within a tolerance range of current and a tolerance range of power factor.

In an embodiment, the computing controller 104 also can determine whether the waveform characteristic of other action stage of the utility power signal corresponding to the current control procedure complies with specific action parameter. For example, when the computing controller 104 identifies that the electric equipment 10 is executing the coffee extraction stage of the control procedure A, and the deviation between the waveform characteristic and the first action parameter of the coffee extraction stage is within a tolerance range, the computing controller 104 further determines whether the waveform characteristic of the utility power signal corresponding to other action stage (such as the boiler heating stage) of the control procedure A satisfies the condition of the action parameter corresponding to other action stage, and triggers a warning event if the determination result is negative.

In the same way, whether the internal elements of the electric equipment 10 operates according to the standards/predetermined state can be determined, and the output quality of the electric equipment 10 can be assured.

Figure 4:
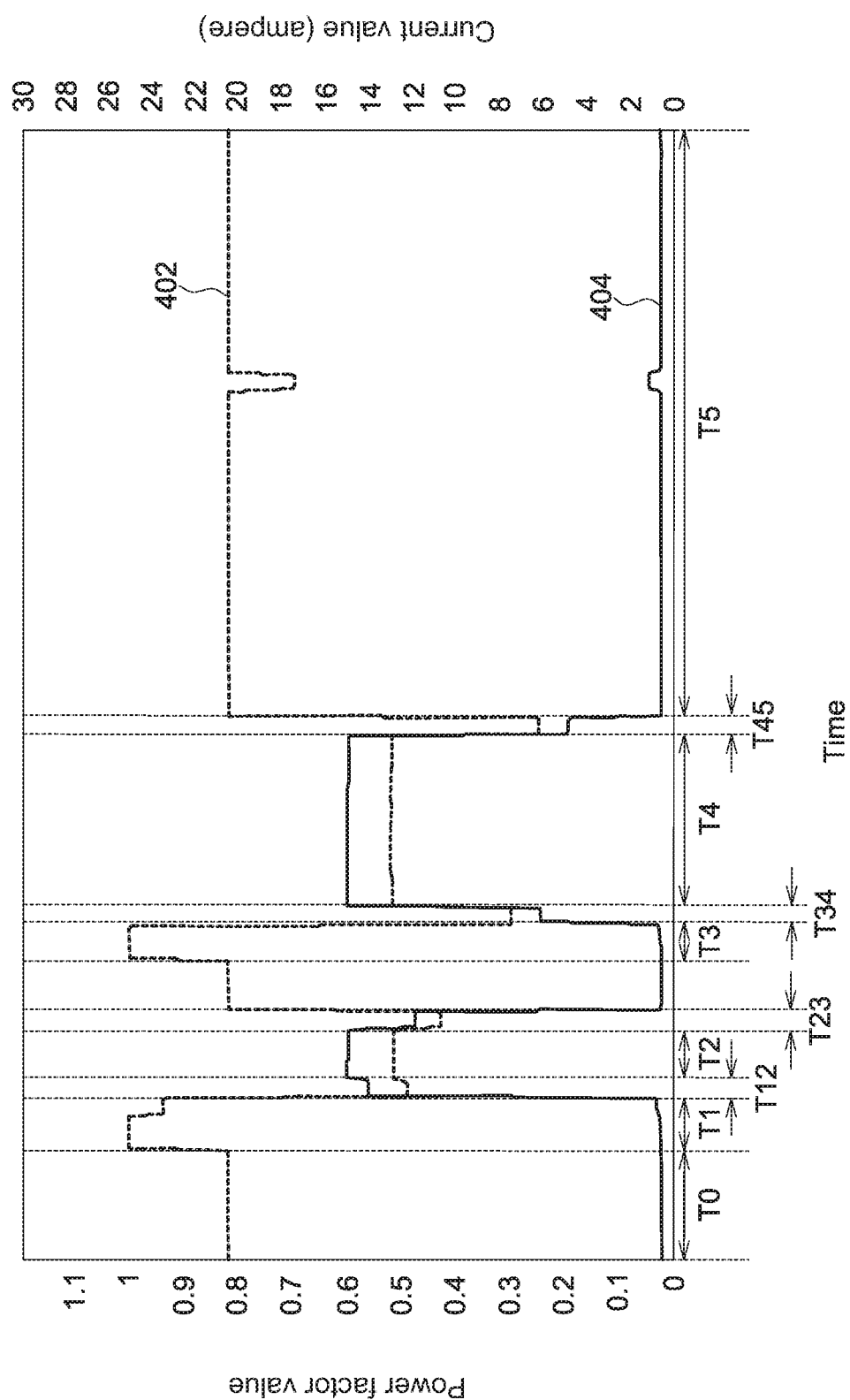
FIG. 4 is an example of waveform of a utility power signal of an electric equipment executing a current control procedure.

FIG. 4 is an example of waveform of a utility power signal of an electric equipment 10 executing a current control procedure. In the present example, the electric equipment 10 is exemplified by a coffee machine, and the utility power signal includes a power factor signal and a current signal measured at the power input end 12 of the electric equipment 10. The power factor signal and the current signal are respectively represented by curve 402 and curve 404. It can be understood that the waveform change of FIG. 4 is merely used for describing the invention, not for limiting the scope of protection of the invention.

Firstly, in period T0, the coffee machine is in a stand-by state. Meanwhile, the value of the power factor signal 402 remains at an initial value (about 0.8), and the current signal 404 remains at a low current value (smaller than 1 ampere).

Next, in the period T1, the value of the power factor signal 402 increases to the maximum (about 1) from the initial value (the stand-by state), but the current signal 404 still remains at the low current value. This indicates that the single phase AC motor of the coffee machine is grinding coffee beans. Therefore, when the power factor signal 402 and the current signal 404 show the waveform change as in the period T1, this indicates that the coffee machine is currently at the grinding stage of the control procedure.

In period T2, the value of the power factor signal 402 drops to a median value (about 0.5), but the value of the current signal 404 increases to a high current value (about 14-16 ampere). This indicates that the proportion of the time when the coffee machine doing virtual work increases, and the interior of the device is being heated by a large current received therein. Therefore, when the power factor signal 402 and the current signal 404 show the waveform change as in period T2, this indicates that the coffee machine is currently in the boiler heating stage of the control procedure. Period T12 and period T23 respectively represent a solenoid valve on stage and a solenoid valve off stage.

In period T3, the power factor signal 402 and the current signal 404 show a waveform change similar to that in period T1. This indicates that the coffee machine again enters the grinding stage of the control procedure.

In period T4, the power factor signal 402 and the current signal 404 show a waveform change similar to that in period T2. This indicates that the coffee machine again enters the boiler heating stage of the control procedure. The transitional period T34 between periods T3 and T4 and the transitional period T45 between periods T4 and T5 respectively indicate the solenoid valve on stage and the solenoid valve off stage.

In period T5, the power factor signal 402 and the current signal 404 show a waveform change similar to that in period T0. This indicates that the coffee machine again returns to the stand-by state.

The research shows that in most applications, the waveform change of the power factor signal of the electric equipment 10 basically can reflect the actions of different stages of the electric equipment 10. In an embodiment, the action type of the electric equipment 10 can be identified according to the power factor signal (that is, the utility power signal, used for identifying or analyzing actions, includes a power factor signal measures at the power input end 12 of the electric equipment 10). In another embodiment, the current signal, the voltage signal and/or other electric parameters of the electric equipment 10 can be further combined to identify the action type of the electric equipment 10 to increase the accuracy for identifying actions. As indicated in FIG. 4, the computing controller 104 identifies the current action stage of the electric equipment 10 according to the characteristics of the power factor signal and the current signal of the power consumed by the electric equipment 10.

To summarize, a method for identifying actions of an electric equipment and an action identification system using the same are disclosed in the invention. The method and system of the invention are capable of identifying the control procedure currently executed by the electric equipment and the action stage of the current control procedure according to the utility power signal of the electric equipment, and determining whether the electric equipment executes one or more action stages of the control procedure according to predetermined parameters. Therefore, although the electric equipment may appear to be in an operating state, the electric equipment still can trigger a warning event to assure the output quality of the electric equipment when the action of the electric equipment executing an automation procedure is deviated from the standard setting.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for identifying actions of an electric equipment, comprising:
    measuring, by a sensor, a utility power signal of the electric equipment during a period of time;
    analyzing, by a computing controller, a waveform characteristic of the utility power signal in the period of time to acquire a set of characteristic values, and identifying a current control procedure corresponding to the utility power signal from a set of control procedures according to the set of characteristic values, wherein the current control procedure includes one or more action stages whose first action stage corresponds to a first action parameter;
    determining, by the computing controller, whether a deviation between the waveform characteristic of the utility power signal corresponding to the first action stage and the first action parameter is within a tolerance range;
    triggering, by the computing controller, a warning event when the deviation between the waveform characteristic of the utility power signal corresponding to the first action stage and the first action parameter is outside the tolerance range;
    wherein each control procedure of the set of control procedures corresponds to a sample characteristic, and the action identifying method further comprises:
    comparing the set of characteristic values with the sample characteristics corresponding to the control procedures to select a control procedure whose sample characteristic is closest to the set of characteristic values from the set of control procedures and using the selected control procedure as the current control procedure.

2. The action identifying method according to claim 1, wherein the first action parameter is a predetermined action time, a predetermined voltage value, a predetermined current value or a predetermined power factor value of the first action stage.

3. The action identifying method according to claim 1, further, comprising:
    determining, by the computing controller, whether a deviation between the waveform characteristic of the utility power signal corresponding to the first action stage and a second action parameter of the first action stage is within another tolerance range when the deviation between the waveform characteristic of the utility power signal corresponding to the first action stage and the first action parameter is within the tolerance range;
    triggering, by the computing controller, the warning event when the deviation between the waveform characteristic of the utility power signal corresponding to the first action stage and the second action parameter is outside the another tolerance range.

4. The action identifying method according to claim 3, wherein the first action parameter is a predetermined action time of waveform change of the first action stage, and the second action parameter is a predetermined voltage value, a predetermined current value or a predetermined power factor value of the first action stage.

5. The action identifying method according to claim 1, wherein the utility power signal comprises a power factor signal measured at a power input end of the electric equipment.

6. The action identifying method according to claim 5, wherein the utility power signal further comprises at least one of a current signal and a voltage signal measured at the power input end of the electric equipment.

7. The action identifying method according to claim 1, wherein the step of generating the set of characteristic values comprises:
    performing a pattern recognition process to waveform change of the utility power signal in the period of time to determine the set of characteristic values of the utility power signal according to a time domain characteristic and/or a frequency domain characteristic of the utility power signal.

8. The action identifying method according to claim triggering 1, wherein the step of triggering the warning event comprises:
    controlling, by the computing controller, a signal transceiver to transmit a warning signal to a remote management platform.

9. The action identifying method according to claim 1, wherein the electric equipment is a coffee machine, the one or more action stages of the current control procedure comprises at least one of a boiler heating stage, a solenoid valve switch stage, a coffee extraction stage and a grinding stage.

10. A method for identifying actions of an electric equipment, comprising:
    measuring, by a sensor, a utility power signal of the electric equipment during a period of time;
    analyzing, by a computing controller, a waveform characteristic of the utility power signal in the period of time to acquire a set of characteristic values, and identifying a current control procedure corresponding to the utility power signal from a set of control procedures according to the set of characteristic values, wherein the current control procedure includes one or more action stages whose first action stage corresponds to a first action parameter;
    determining, by the computing controller, whether a deviation between the waveform characteristic of the utility power signal corresponding to the first action stage and the first action parameter is within a tolerance range;
    triggering, by the computing controller, a warning event when the deviation between the waveform characteristic of the utility power signal corresponding to the first action stage and the first action parameter is outside the tolerance range;
    wherein the step of triggering the warning event comprises:
    controlling, by the computing controller, a signal transceiver to transmit a warning signal to a remote management platform.

11. An action identification system applicable to an electric equipment, wherein the action identification system comprises:
    a sensor used for measuring a utility power signal of the electric equipment during a period of time; and
    a computing controller coupled to the sensor and used for:
    analyzing a waveform characteristic of the utility power signal in the period of time to acquire a set of characteristic values, and identifying a current control procedure corresponding to the utility power signal from a set of control procedures according to the set of characteristic values, wherein the current control procedure comprises one or more action stages whose first action stage corresponds to a first action parameter;

determining whether a deviation between the waveform characteristic of the utility power signal corresponding to the first action stage and the first action parameter is within a tolerance range; and triggering a warning event when the deviation between the waveform characteristic of the utility power signal corresponding to the first action stage and the first action parameter is outside the tolerance range;

wherein each control procedure of the set of control procedures corresponds to a sample characteristic, and the computing controller compares the set of characteristic values with the sample characteristics corresponding to the control procedures to select a control procedure whose sample characteristic is closest to the set of characteristic values from the set of control procedures and uses the selected control procedure as the current control procedure.

12. The action identification system according to claim 11, wherein the first action parameter is a predetermined action time, a predetermined voltage value, a predetermined current value or a predetermined power factor value of the first action stage.

13. The action identification system according to claim 12, wherein the computing controller further determines whether a deviation between the waveform characteristic of the utility power signal corresponding to the first action stage and a second action parameter of the first action stage is within another tolerance range when the deviation between the waveform characteristic of the utility power signal corresponding to the first action stage and the first action parameter is within the tolerance range, and triggers the warning event when the determination result is negative.

14. The action identification system according to claim 13, wherein the first action parameter is the predetermined action time of waveform change of the first action stage, and the second action parameter comprises at least one of the predetermined voltage value, the predetermined current value or the predetermined power factor value of the first action stage.

15. The action identification system according to claim 11, wherein the utility power signal comprises a power factor signal measured at a power input end of the electric equipment.

16. The action identification system according to claim 15, wherein the utility power signal further comprises at least one of a current signal and a voltage signal measured at the power input end of the electric equipment.

17. The action identification system according to claim 11, wherein the computing controller performs a pattern recognition process to waveform change of the utility power signal in the period of time to determine the set of characteristic values of the utility power signal according to a time domain characteristic and/or a frequency domain characteristic of the utility power signal.

18. The action identification system according to claim 11, further, comprising:
a signal transceiver controlled by the computing controller;
wherein the computing controller triggers the warning event, and the computing controller controls the signal transceiver to transmit a warning signal to a remote management platform.

19. The action identification system according to claim 11, wherein the electric equipment is a coffee machine, the one or more action stages of the current control procedure comprises at least one of a boiler heating stage, a solenoid valve switch stage, a coffee extraction stage and a grinding stage.

20. The action identification system according to claim 11, wherein the sensor is disposed inside the electric equipment and coupled to a power input end of the electric equipment or is disposed in a smart watch which is connected to the power input end of the electric equipment through a power supply line.

* * * * *